(12) United States Patent
Froment et al.

(10) Patent No.: US 10,770,357 B2
(45) Date of Patent: *Sep. 8, 2020

(54) INTEGRATED CIRCUIT WITH IMPROVED RESISTIVE REGION

(71) Applicants: STMicroelectronics (Crolles 2) SAS, Crolles (FR); STMicroelectronics (Rousset) SAS, Rousset (FR)

(72) Inventors: Benoit Froment, Grenoble (FR); Stephan Niel, Meylan (FR); Arnaud Regnier, Les Taillades (FR); Abderrezak Marzaki, Aix en Provence (FR)

(73) Assignees: STMicroelectronics (Crolles 2) SAS, Crolles (FR); STMicroelectronics (Rousset) SAS, Rousset (FR)

( * ) Notice: Subject to any disclaimer, the term of this patent is extended or adjusted under 35 U.S.C. 154(b) by 0 days.

This patent is subject to a terminal disclaimer.

(21) Appl. No.: 16/429,836

(22) Filed: Jun. 3, 2019

(65) Prior Publication Data
US 2019/0287862 A1    Sep. 19, 2019

Related U.S. Application Data

(62) Division of application No. 15/723,528, filed on Oct. 3, 2017, now Pat. No. 10,354,926.

(30) Foreign Application Priority Data

Feb. 28, 2017   (FR) ..................................... 17 51596

(51) Int. Cl.
*H01L 21/8234* (2006.01)
*H01L 21/762* (2006.01)
(Continued)

(52) U.S. Cl.
CPC ..... *H01L 21/823493* (2013.01); *H01C 7/126* (2013.01); *H01L 21/743* (2013.01);
(Continued)

(58) Field of Classification Search
CPC ......... H01L 21/823493; H01L 23/5228; H01L 29/0649; H01L 29/0692; H01L 21/76264;
(Continued)

(56) References Cited

U.S. PATENT DOCUMENTS 5,880,001 A   3/1999 Camenzind
5,883,566 A   3/1999 Nowak et al.
(Continued)

FOREIGN PATENT DOCUMENTS

EP    1100126 A2   5/2001

OTHER PUBLICATIONS

INPI Search Report and Written Opinion for FR 1751596 dated Oct. 17, 2017 (13 pages).

*Primary Examiner* — Syed I Gheyas
(74) *Attorney, Agent, or Firm* — Crowe & Dunlevy

(57) ABSTRACT

An integrated circuit includes a semiconductor substrate with an electrically isolated semiconductor well. An upper trench isolation extends from a front face of the semiconductor well to a depth located a distance from the bottom of the well. Two additional isolating zones are electrically insulated from the semiconductor well and extending inside the semiconductor well in a first direction and vertically from the front face to the bottom of the semiconductor well. At least one hemmed resistive region is bounded by the two additional isolating zones, the upper trench isolation and the bottom of the semiconductor well. Electrical contacts are electrically coupled to the hemmed resistive region.

25 Claims, 6 Drawing Sheets

(51) Int. Cl.
  *H01L 21/74* (2006.01)
  *H01L 27/08* (2006.01)
  *H01L 49/02* (2006.01)
  *H01C 7/12* (2006.01)
  *H01L 21/765* (2006.01)
  *H01L 29/8605* (2006.01)
  *H01L 29/06* (2006.01)
  *H01L 23/522* (2006.01)

(52) U.S. Cl.
  CPC ...... *H01L 21/765* (2013.01); *H01L 21/76224* (2013.01); *H01L 21/76264* (2013.01); *H01L 21/76283* (2013.01); *H01L 21/76286* (2013.01); *H01L 23/5228* (2013.01); *H01L 27/0802* (2013.01); *H01L 28/20* (2013.01); *H01L 29/0649* (2013.01); *H01L 29/0692* (2013.01); *H01L 29/8605* (2013.01)

(58) Field of Classification Search
  CPC ......... H01L 21/76283; H01L 21/76286; H01L 21/765; H01L 29/8605; H01L 21/76224; H01L 21/743; H01L 27/0802; H01L 28/20; H01L 23/647; H01L 27/0207; H01C 7/126
  See application file for complete search history.

(56) References Cited

U.S. PATENT DOCUMENTS

| | | |
|---|---|---|
| 8,125,019 B2 | 2/2012 | Voegeli et al. |
| 2001/0022385 A1 | 9/2001 | Sakakibara et al. |
| 2007/0040236 A1 | 2/2007 | Nowak et al. |
| 2008/0030297 A1 | 2/2008 | Ohtsuka et al. |
| 2008/0085569 A1 | 4/2008 | Wang et al. |
| 2016/0049470 A1 | 2/2016 | Hayashi |
| 2016/0358905 A1 | 12/2016 | Balakrishnan et al. |

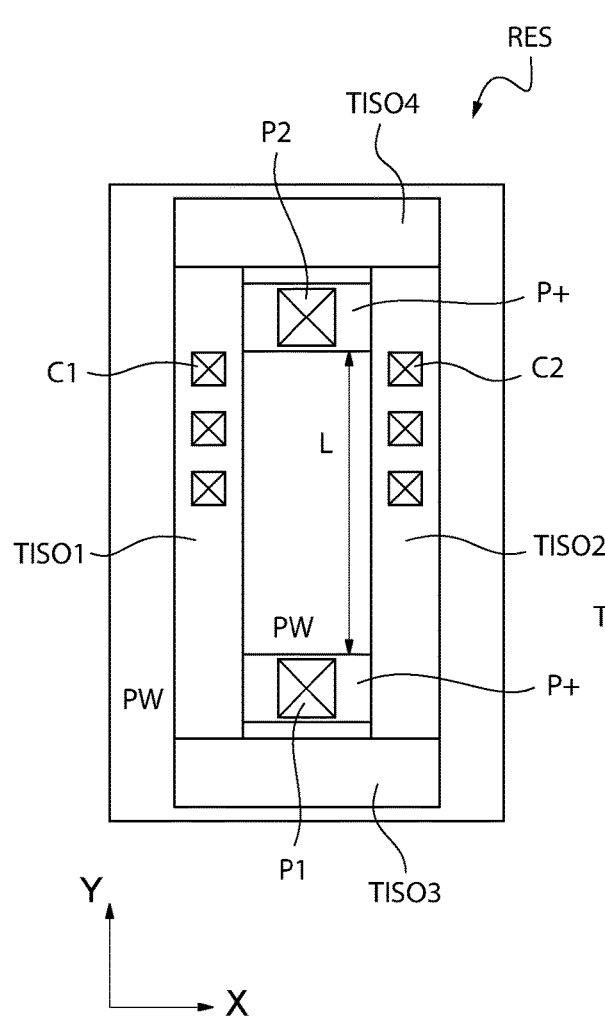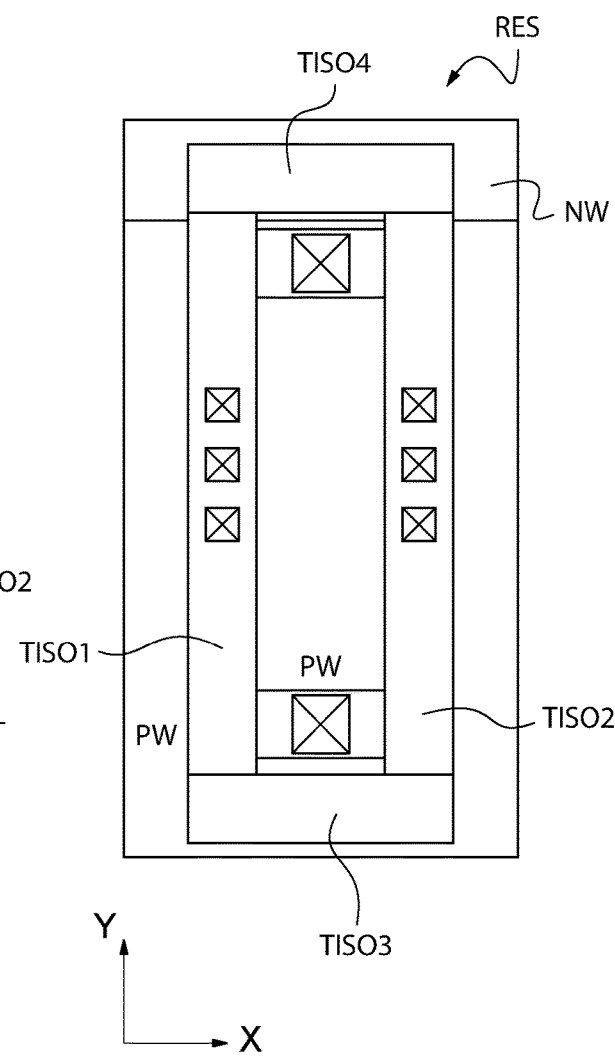

INTEGRATED CIRCUIT WITH IMPROVED RESISTIVE REGION

CROSS-REFERENCE TO RELATED APPLICATIONS

This application is a divisional of U.S. application for patent Ser. No. 15/723,528 filed Oct. 3, 2017, which claims the priority benefit of French Application for Patent No. 1751596, filed on Feb. 28, 2017, the disclosures of which are hereby incorporated by reference in their entireties to the maximum extent allowable by law.

TECHNICAL FIELD

Embodiments relate to integrated circuits and in particular to the production of resistors and, in particular, varistors.

BACKGROUND

FIGS. 1 and 2 show an example of a resistor produced in an integrated circuit, FIG. 2 shows a view from above of FIG. 1 generally in a plane II-II and FIG. 1 shows a cross-sectional view through FIG. 2 in a plane I-I.

In this example, the resistor is formed in a semiconductor well PW that is of the triple-well type, i.e. the well PW is isolated from a semiconductor substrate PSUB by an isolating layer NISO and isolating regions NW.

The two terminals P1, P2 of the resistor are formed by highly doped P+ contact zones located on the surface of the well PW (i.e. level with a front face of said well). The contact zones are electrically isolated from each other by the conventional means of an insulating shallow trench isolation STI. The shallow trench isolation STI, which covers most of the surface of the well PW, has deliberately not been shown in FIG. 2 for the sake of clarity.

Thus, a resistive region through which a current may flow, for example when a voltage is applied across the terminals P1 and P2, is formed by the material forming the well PW having a given resistivity (in particular dependent on the density of implanted dopant), with that region of the well PW electrically connecting the terminals P1 and P2. The region of the well PW forming the resistive region is, in particular, located between the shallow trench isolation STI and the buried layer NISO.

FIG. 3 shows another example of a resistor of an integrated circuit, in which two terminals P1 and P2 are electrically connected by a conductive track PCR. This type of embodiment is generally formed on the surface of a substrate or of a semiconductor well or indeed in the interconnect levels of the integrated circuit.

The conductive track PCR is made from a conductor having a resistivity chosen depending on the requirements, for example silicided N+ polysilicon, N+ polysilicon, P+ polysilicon, P+ silicon, or a metal.

The conductive track PCR having a given resistivity also forms a resistive region through which a current may flow, for example when a voltage is applied across the terminals P1 and P2.

In these two example resistors, the resistance R of the resistor may be expressed by the approximation $R=\rho*L/S$, where $\rho$ is the resistivity of the material of the resistive region, L is the length of the resistive region (i.e. the distance travelled in the resistive region to get between the terminals P1 and P2), and S is the area of a cross section of the resistive region.

Configuring the metal tracks PCR so that they have a sinuous shape, i.e. what is called a "serpentine", as shown in FIG. 3, allows the length L of the resistive region to be increased while limiting the substrate area occupied between the two terminals P1 and P2. The resistance R of the resistor may be modified between various embodiments by varying the length L.

However, in embodiments of the type of the preceding examples, it is difficult to control the area S of the cross section of the resistive region, for example because of constraints on production of the conductive tracks PCR, or, as FIG. 2 shows, because the "width" D of the cross section of the resistive region is not very controllable and cannot be considerably decreased because of constraints on the formation, often by lithography or implantation, of the regions NW defining the edges of said resistive region.

Furthermore, it is desirable to minimize the space occupied in and on the substrate or semiconductor well by the components of an integrated circuit.

SUMMARY

According to embodiments, it is advantageously proposed to introduce additional isolating zones allowing the area of the cross section of the resistive region to be decreased, and thus the resistance of a resistor of an integrated circuit to be increased while decreasing the space occupied thereby.

Thus, according to one aspect, an integrated circuit is provided including: a semiconductor substrate, and a semiconductor well of a first conductivity type electrically isolated from the rest of the substrate by an isolating region; an upper trench isolation extending from a front face of the well to a depth located a distance from the bottom of the well; and at least two additional isolating zones that are electrically insulated from the well. Said at least two additional isolating zones extend inside the well in a first, for example longitudinal, direction and vertically from the front face to the bottom of the well. The integrated circuit furthermore includes at least one hemmed resistive region bounded by said at least two additional isolating zones, the upper trench isolation and the isolating region, and includes at least two contact zones located level with the front face of the well and electrically coupled to said at least one hemmed resistive region.

The resistive region, thus bounded in particular by the additional isolating zones, has a cross section with an area that is much narrower than in conventional embodiments. Specifically, the resistive region is hemmed by the additional isolating zones located in the well, and does not extend throughout the well. This allows the resistance of a resistor of an integrated circuit to be increased while minimizing its size.

Said hemmed resistive region may be bounded in a second direction that is orthogonal to the first direction, for example laterally, by two of said at least two additional isolating zones, and vertically on the one hand by the upper trench isolation and on the other hand by the isolating region.

For example, the isolating region may include a buried semiconductor layer of the second conductivity type, defining the bottom of said well, and at least one semiconductor region of the second conductivity type, defining at least one edge of said well from the front face to the bottom of the well. This corresponds to an embodiment of the triple-well type.

For example, the upper trench isolation is a shallow trench isolation, i.e. a trench, the depth of which is comprised between 200 nm and 400 nm, filled with an insulator. Shallow trench isolations are conventional elements of integrated circuits and the shallow trench isolation here allows, with the bottom of the well, the area of the hemmed resistive region to be bounded vertically without cost in terms of fabrication steps.

Said at least two contact zones, for example, include a highly doped semiconductor volume of the first conductivity type.

According to one embodiment, said additional isolating zones each include a trench having an end which reaches the bottom of the well.

The additional isolating zones may each include a trench and an implanted region of the second conductivity type, which region is located in the well between the end of the trenches and the bottom of the well.

Said trenches may be filled with an insulator, or may be filled with a conductor, in which case said additional isolating zones include an insulating liner covering at least that portion of the walls of said trenches which is contiguous to the well, and contacts on that portion of said trenches which is level with the front face of the well.

According to one embodiment, said additional isolating zones are suitable for being biased so as to form space-charge zones in the well in the vicinity of the walls of said trenches, said space-charge zones bounding more narrowly said at least one hemmed resistive region.

This makes it possible to decrease the electrically effective area of the cross section of the hemmed resistive region, and thus to controllably increase resistance by biasing the additional isolating zones.

According to one embodiment, the isolating region is suitable for being biased so as to form space-charge zones in the well in the vicinity of the edges of the isolating region, and where appropriate in the vicinity of said implanted regions, said space-charge zones bounding more narrowly said at least one hemmed resistive region.

According to one embodiment, the well includes a plurality of hemmed resistive regions that are parallel and mutually electrically coupled so as to form a sinuous resistive path.

The parallel resistive regions may for example be arranged side-by-side in a second direction orthogonal to the first direction, and be electrically coupled on alternatively each of their ends in the first direction, in order to form the sinuous resistive path.

Two hemmed resistive regions that are successive in a second direction orthogonal to the first direction may be electrically coupled by interconnects passing over an additional isolating zone located between said two successive hemmed resistive regions.

Two hemmed resistive regions that are successive in a second direction orthogonal to the first direction may be electrically coupled by a resistive region of the well, which region is located at an end, in the first direction, of the additional isolating zone, and located between said two successive hemmed resistive regions.

Two hemmed resistive regions that are successive in a second direction orthogonal to the first direction may be electrically coupled by way of the conductor filling the trench of the additional isolating zone located between said two successive hemmed resistive regions, and of interconnects electrically connecting the conductor filling said trench, on the one hand to one of said two hemmed resistive regions and on the other hand to the other of said two hemmed resistive regions.

BRIEF DESCRIPTION OF THE DRAWINGS

Other advantages and features of the invention will become apparent on examining the completely nonlimiting detailed description of embodiments and the appended drawings, in which:

FIGS. 7 and 8 shows variants in which length is not dependent on the dimension of the well;

DETAILED DESCRIPTION

Figure 4:
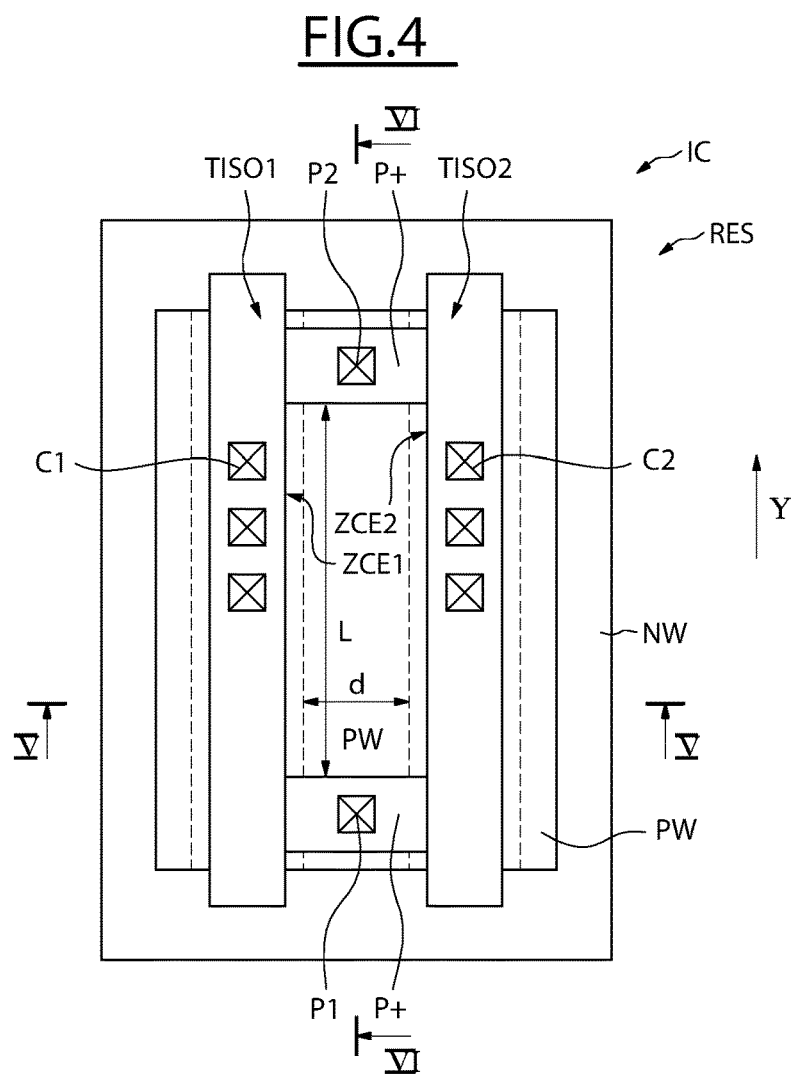
FIGS. 4 to 6 show one example embodiment of an integrated circuit resistor.
Figure 5:
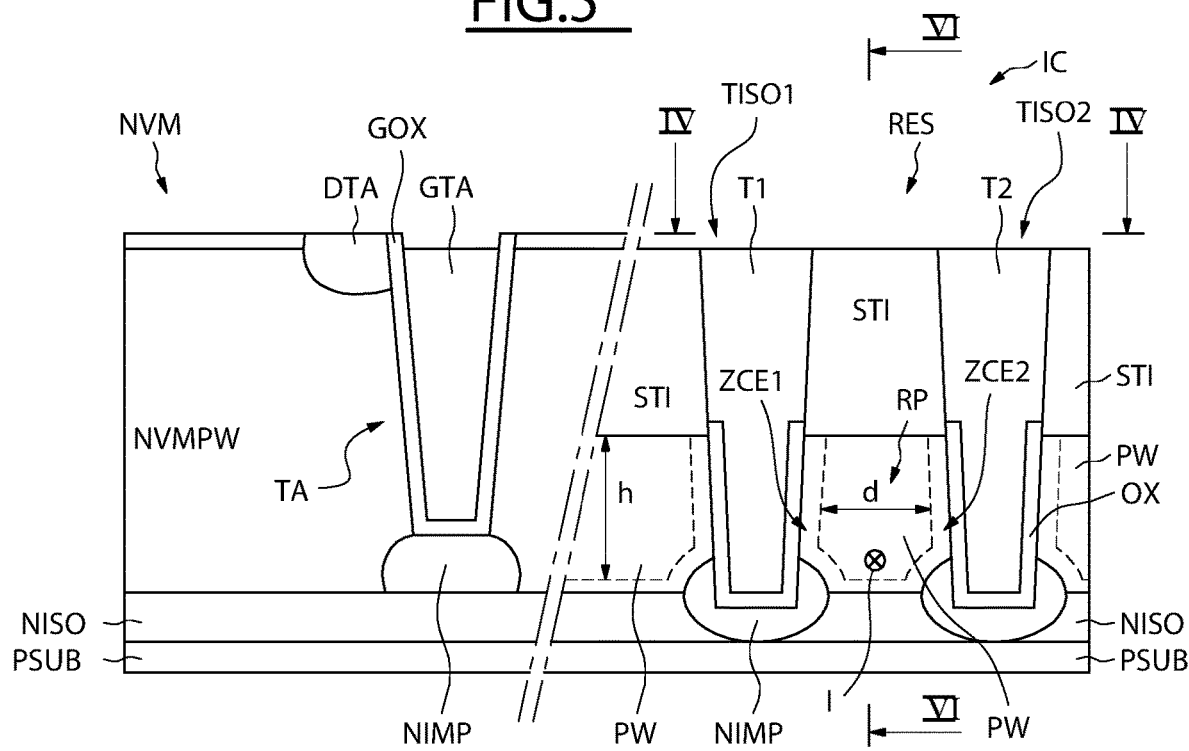
Figure 6:
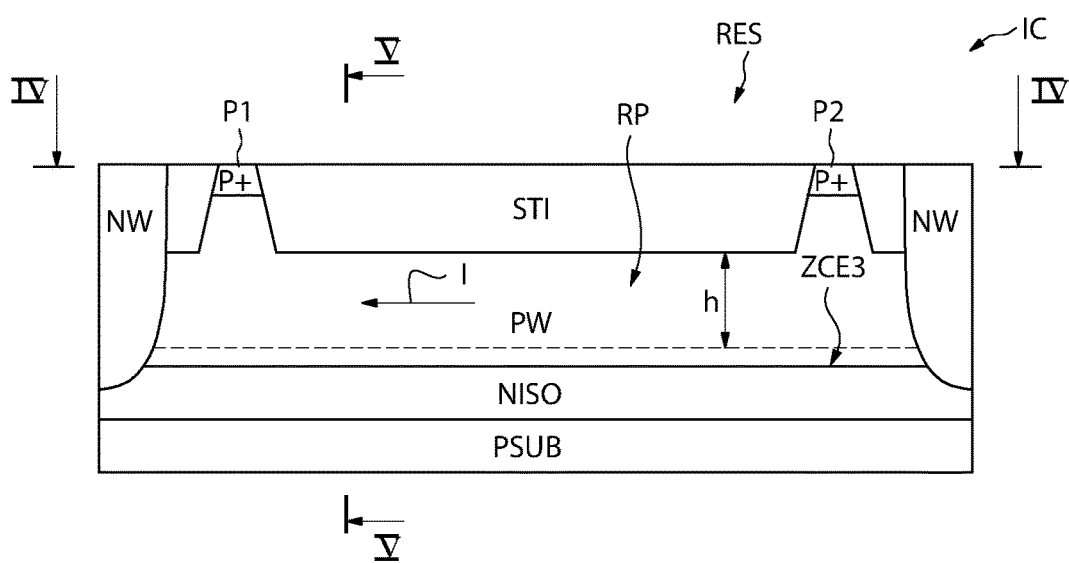

FIGS. 4, 5 and 6 show one example of one embodiment of an integrated circuit including a hemmed resistive region included in a resistive region formed in a well.

FIG. 4 shows a view from above FIGS. 5 and 6 in a plane IV-IV, FIG. 5 shows a cross-sectional view through FIGS. 4 and 6 in a plane V-V and FIG. 6 shows a cross-sectional view through FIGS. 4 and 5 in a plane VI-VI. The shallow trench isolation STI, which covers most of the surface of the well PW, has deliberately not been shown in FIG. 4 to increase clarity.

A semiconductor well PW, which for example is p-type, is formed in a semiconductor substrate PSUB of an integrated circuit IC. The well PW may be of the same conductivity type as the substrate PSUB, in which case the structure takes the form of a triple well, i.e. well PW is isolated from the rest of the substrate PSUB by an isolating region formed by the well NW and region NISO. The well PW may be of opposite conductivity type to that of the substrate, in which case it takes the form of a single well, which is isolated from the rest of the substrate by an isolating region such as a p-n junction.

The isolating region of a triple well may, for example, include a buried layer NISO of opposite conductivity type to that of the substrate and semiconductor regions NW of the opposite conductivity type to that of the substrate, said regions being implanted and extending from the front face of the well to the buried layer.

In the example of FIGS. 4 to 6, a resistor RES is produced in a p-type triple well PW that is isolated from the rest of the substrate PSUB by n-type buried layer NISO and n-type semiconductor regions NW.

Figure 1:
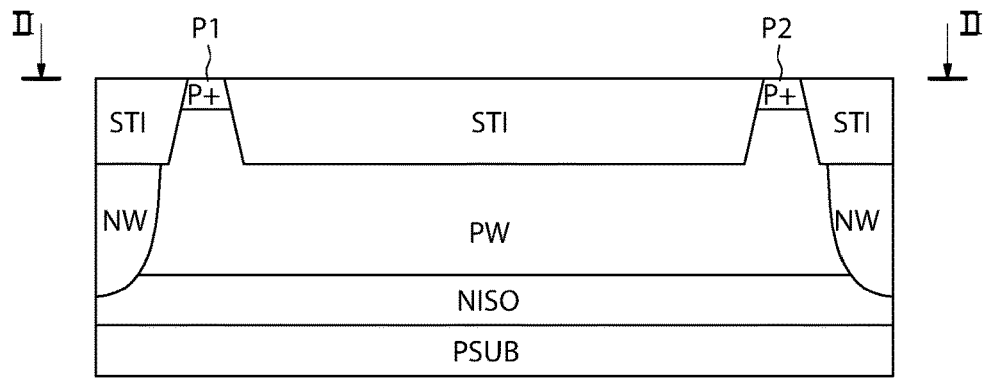
FIGS. 1 to 3, which were described above, show examples of conventional embodiments of integrated-circuit resistors.
Figure 2:
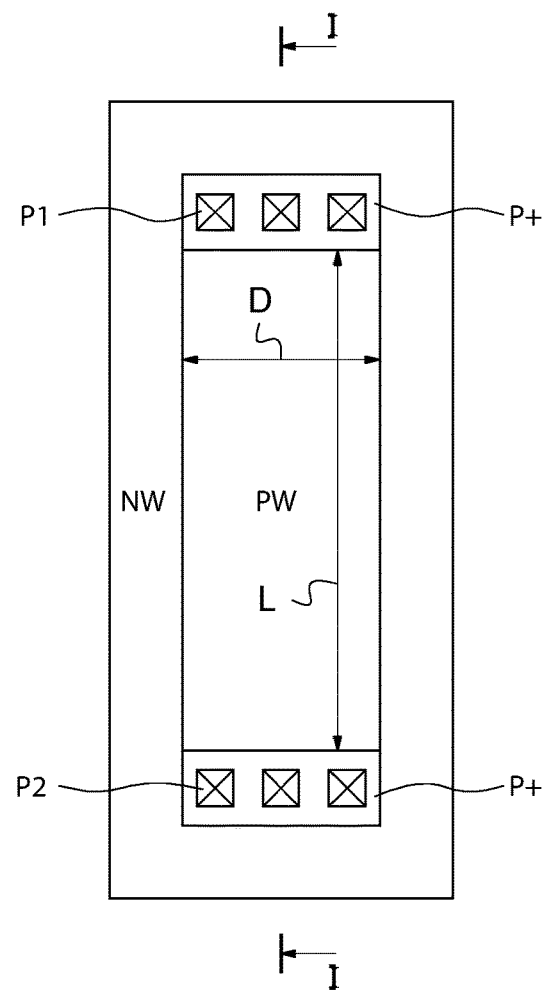
Figure 3:
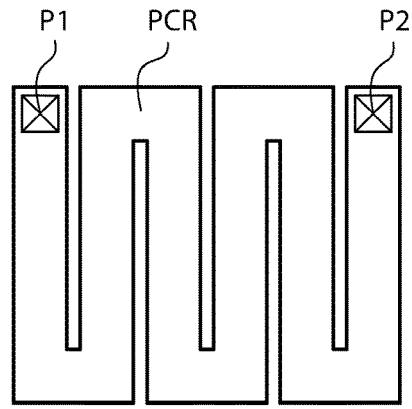

The semiconductor regions NW shown differ from regions NW in FIG. 1 in that they extend as far as to a front face of the semiconductor substrate in order, as detailed below, to make it possible to form an electric contact thereon in order to apply a bias thereto.

Two terminals P1, P2 of the resistor RES are formed level with the front face of the well, for example by implanting two regions that are highly doped (i.e., doped so that their dopant concentration is between $5\times10^{18}$ atoms/cm$^3$ et $5\times10^{20}$ atoms/cm$^3$) p-type (P+ regions) forming zones of contact with the active region of the well PW.

The terminals P1, P2 are isolated from each other by virtue of an upper trench isolation that does not extend deeply into the well PW, for example by means of a conventional shallow trench isolation, which trench isolation has been given the reference STI.

Each terminal P1, P2 is electrically coupled to what is called a resistive region of the well PW, which region is intended to pass a current I between the two terminals P1, P2, for example when a voltage is applied thereacross.

From one terminal of the resistor RES to the other, the resistive region forms a channel, referred to as a resistive path, and the area of the cross section and the length of this channel, and the resistivity of the material of the well PW, characterize the resistance R of the resistor RES.

As introduced above, the resistance R of the resistor RES may be expressed by the approximation $R=\rho*L/S$, where $\rho$ is the resistivity of said region, L the length of the channel connecting one terminal to the other, and S the area of the cross section of said channel.

The resistivity of the material of the well in particular depends on the concentration and type of dopant implanted.

Furthermore, the integrated circuit includes, in this example, two additional isolating zones TISO1, TISO2 that extend longitudinally in a first direction Y and vertically from the front face to the bottom of the well PW.

Said two additional isolating zones TISO1, TISO2 each include a trench T1, T2 the bottom of which extends as far as to the bottom of the well PW, filled with a conductor such as a metal or doped polysilicon.

The conductor that fills said trenches T1, T2 is electrically insulated from the well PW by an insulating liner OX covering at least that portion of the walls of said trenches T1, T2 which is contiguous to said well PW (i.e. the walls of the portions of the trenches T1, T2 formed in the well PW).

The two terminals P1, P2 of the resistor RES are located between said two additional isolating zones TISO1, TISO2, and the additional isolating zones TISO1, TISO2 bound laterally the width d of the resistive region.

Moreover, the height h of the resistive region is bounded vertically on the one hand by the upper trench isolation STI and on the other hand by the buried layer NISO (i.e. the bottom of the well PW).

According to one advantageous embodiment, the additional isolating zones TISO1, TISO2 are fabricated in, for example, a step of fabricating a vertical buried gate of a transistor TA in another area of the substrate. For example, as shown in the left-hand part of FIG. 5, the transistor TA may be an access transistor of a memory cell NVM of a non-volatile memory located in another well NVMPW formed in the same substrate PSUB.

The vertical-gate access transistor TA includes a source region NISO, a drain region DTA, and a vertical gate GTA, which is, for example, formed by depositing a conductor such as a metal or doped polysilicon in a trench, said conductor being insulated from the well NVMPW by a layer of gate oxide GOX.

Techniques for fabricating such vertical gates GTA are known and commonly employed in the present technological field. Thus, since the additional isolating zones are advantageously fabricated at the same time as the vertical gates GTA are produced, no additional steps are introduced into the process flow.

The vertical gate GTA shown in FIG. 5 includes an n-type implanted region NIMP, in order to "connect" the buried layer NISO that plays the role of source region to one edge of the gate GTA.

The reason for this is that the etching of the trench accommodating the vertical gate GTA does not necessarily reach the buried layer NISO satisfactorily. In FIG. 5, the trenches T1 and T2 etched in the same step as the trench accommodating the vertical gate GTA do, however, reach the bottom of the well PW (i.e. the buried layer NISO). This is, in particular, because conventional etching processes are more effective in the upper trench isolation STI than in the semiconductor wells PW and NVMPW.

Nevertheless, the implanted region NIMP is still formed in the bottom of the trenches T1, T2, because provision has already been made therefor in the process for fabricating the trenches accommodating the vertical gate GTA of the access transistor TA.

This embodiment is not limited to non-volatile memory technologies, but to any technology in which provision is made for vertical-gate-type structures, for example high-voltage technology, logic-circuit technology, or even amplification technology. Each of these technologies is subject to constraints such as doping concentrations and component dimensions that are specific thereto and that are compatible with the production of a resistor RES according to the embodiments presented here.

Furthermore, the techniques used to etch and fill the trenches T1, T2 allow the parallel additional isolating zones to be produced close to one another, for example spaced apart by about one-hundred nanometers.

Thus, the two additional isolating zones TISO1 and TISO2 bound laterally a very narrow region of the resistive region, which is called the hemmed resistive region RP.

This allows the area of the cross section of the resistive region to be decreased and thus the resistance R of the resistor RES to be increased without increasing the area occupied thereby on the front face of the well.

Furthermore, contact zones C1, C2 formed on that portion of the trenches T1, T2 which is located level with the front face of the well PW allow a bias to be applied to the conductor deposited in said trenches T1, T2.

A bias appropriate for the conductivity type of the semiconductor of the hemmed resistive region RP allows space-charge zones ZCE1, ZCE2 to be created, said zones extending in the hemmed resistive region RP in the vicinity of the walls of the respective additional isolating zones TISO1, TISO2.

For example, a bias appropriate for creating a space-charge zone in a p-type well is a bias of positive sign, and of negative sign in an n-type well.

Since the space-charge zones are not conductive, the area of the cross section of the hemmed resistive region through which a current may flow is decreased, and the resistance R of the resistor RES increases.

In other words, applying an appropriate potential to the additional isolating zones TISO1, TIOS2 allows the width d of the hemmed resistive region RP to be artificially decreased, and the resistance R of the resistor RES to be increased.

Furthermore, suitable biasing of the isolating region (NISO, NW), for example by means of contact regions produced level with the front face on the semiconductor regions NW, also allow a space-charge zone ZCE3 to be created in the vicinity of said isolating region (NISO, NW).

Likewise, the space-charge zones ZCE3 allow the area of the cross section of the channel of the resistive region to be decreased, and thus the resistance R of the resistor RES to be increased. In particular, the space-charge zone ZCE3 located in the bottom of the well in the vicinity of the layer NISO artificially decreases the height h of the cross section of the hemmed resistive region RP.

Thus, the resistance R of the resistor RES is controllable by applying biases to the additional isolating zones filled with a conductor that is insulated from the well, and/or to the isolating region (NISO, NW) of the triple well PW.

Control means of the integrated circuit may control the application of higher or lower (in absolute value) potentials to said isolating region and zones in order to modify the resistance R of the resistor RES.

In FIGS. 4 to 6 described above, the hemmed resistive region located in the well PW is separated from the rest of the substrate PSUB, in the Y-direction, by virtue of the semiconductor regions NW.

This constrains the length L (on which the resistance R of the resistor RES depends) to the dimension of the well PW (in the Y-direction). However, it is desirable to be able to set this length independently of the dimension of the well PW.

FIGS. 7 and 8 shows variants in which the length L is not dependent on the dimension of the well PW, the integrated circuit including two additional isolating zones TISO3 and TISO4 extending in a second direction X perpendicular to the first direction Y.

The additional isolating zones TISO3 and TISO4 also extend vertically from the front face as far as to the bottom of the well.

These additional isolating zones TISO3 and TISO4 allow the resistive region to be bounded longitudinally (in the Y-direction) and it to be isolated from the rest of the well PW.

Thus, the length L may be dimensioned more freely and the resistor RES placed in various positions in the well PW, without creating problems with leakage currents.

FIG. 8 shows a structure similar to the structure shown in FIG. 7 but in which the additional isolating zone TISO4 is produced in a semiconductor region NW but the additional isolating zone TISO3 is not.

This on the one hand allows space to be saved in the longitudinal direction, and on the other hand the region NW and the buried layer NISO to be biased directly when the isolating regions TISO1 and TISO2 are biased, by electrically coupling the additional isolating zone TISO4 to the region NW, for example via the absence of the insulating liner in the additional isolating zone TISO4 located in said region NW.

Figure 9:
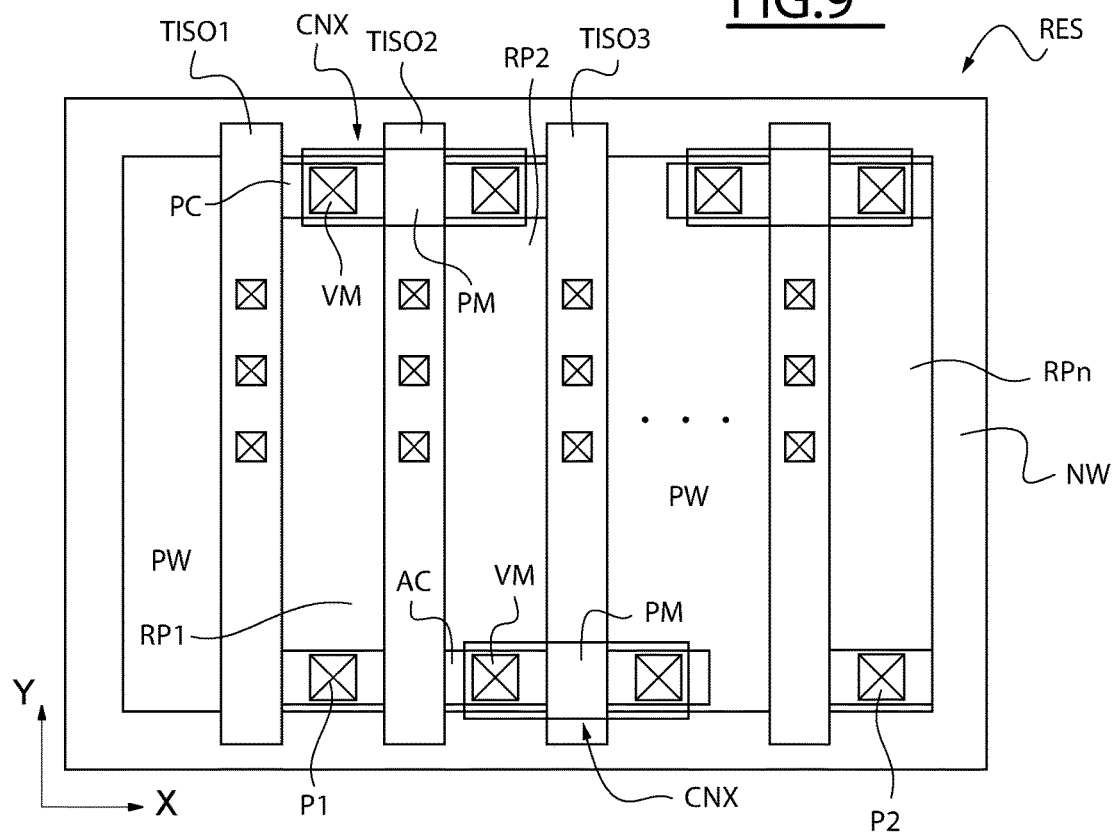
FIGS. 9 to 11 show examples of embodiments having a sinuous resistive path.
Figure 10:
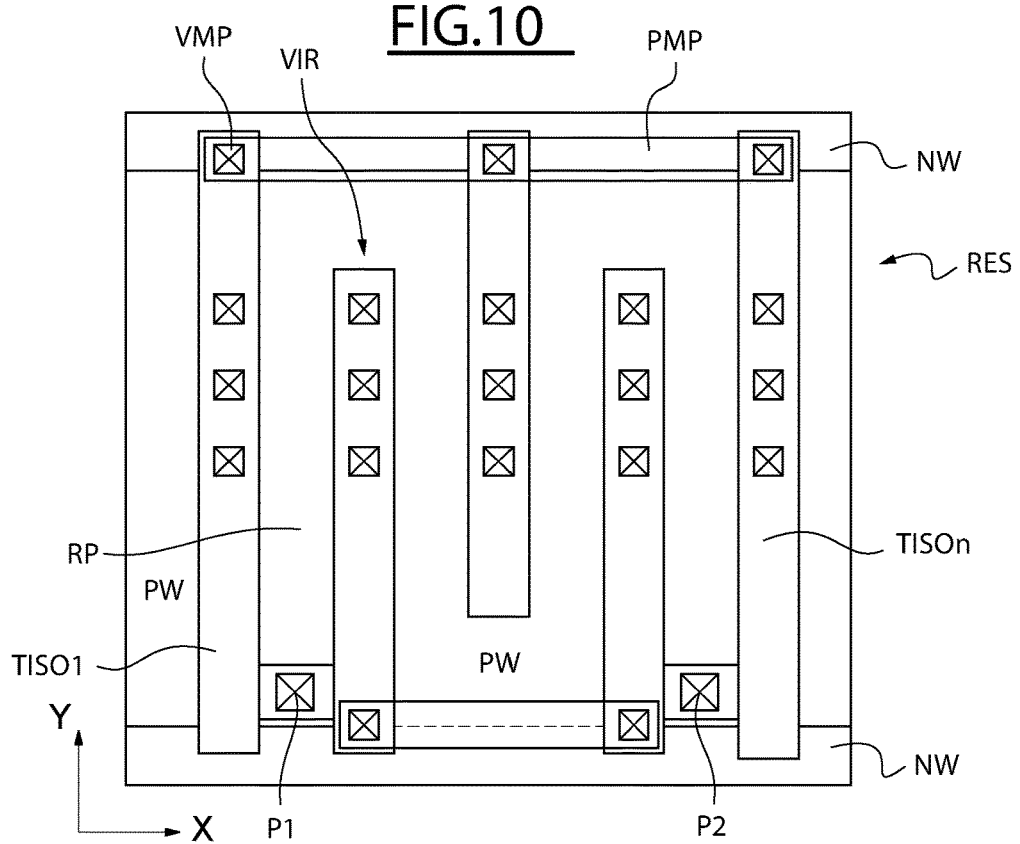
Figure 11:
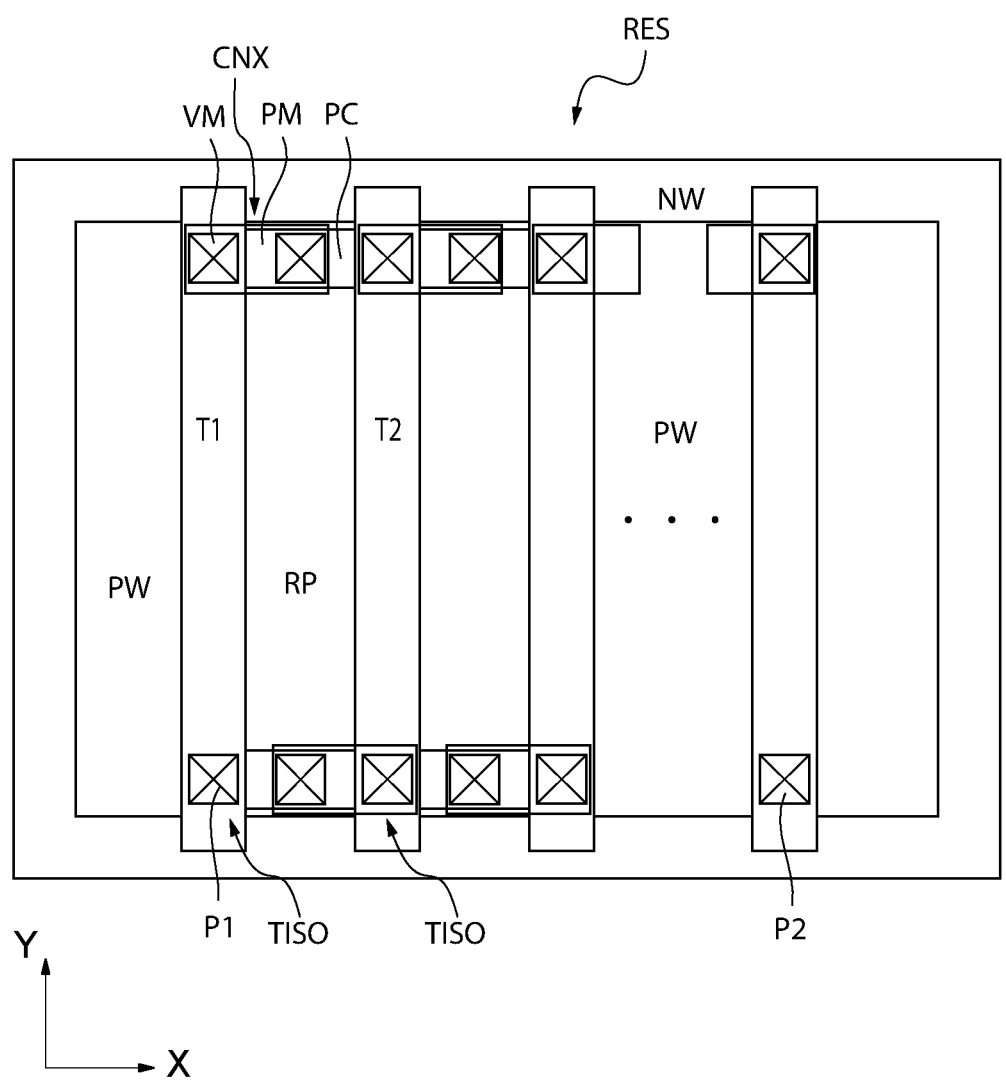

FIGS. 9 to 11 show examples of embodiments in which the resistive path has a sinuous, or crenelated, or serpentine shape, i.e. the path forms a plurality of consecutive "half-turn" loops, in order to maximize the distance between its ends while minimizing the space occupied.

In these embodiments, the well includes a plurality of hemmed resistive regions RP, RP1 to RPn that are parallel and mutually electrically coupled so as to form a sinuous resistive path.

The hemmed resistive regions RP, RP1 to RPn are arranged side-by-side in the X-direction, and are electrically coupled on alternatively each of their ends (considered in the Y-direction) to the next hemmed resistive region, in order to form the sinuous resistive path.

FIG. 9 shows an example embodiment in which the resistive path has a sinuous shape.

In this example, a hemmed resistive region RPn is bounded laterally by two additional isolating zones TISO, in a similar way to the way in which the hemmed resistive region RP described above with reference to FIGS. 4 to 6 was bounded.

However, a hemmed resistive region may be bounded laterally on the one hand by an additional isolating zone and on the other hand by the isolating region of the triple well, in particular the semiconductor region NW, as for example the hemmed resistive region RPn located furthest to the right in FIG. 9.

In other words, the hemmed resistive region RPn may be bounded laterally either by two additional isolating zones, or by an additional isolating zone on the one hand and by the isolating region (NW) on the other hand.

Furthermore, an additional isolating region TISO2 is advantageously common to two consecutive hemmed resistive regions RP1, RP2.

Interconnects CNX electrically connect two consecutive hemmed resistive regions RP, for example by means of a conductive track PM passing over the additional isolating zone TISO located between said regions.

The resistive regions are electrically connected to the metal track PM by virtue of an over-doped p$^+$ contact region PC located level with the front face of the well PW, to which an interconnecting via VM connected to the conductive track PM is electrically connected.

The interconnecting vias VM and the conductive tracks PM are, for example, located in the first interconnect levels of the integrated circuit.

This configuration allows the length L of the resistive path to be increased according to a compact and simple embodiment.

This configuration also makes it possible to capitalize upon the ability to produce a varistor by applying a potential to the additional isolating regions.

FIG. 10 shows another example embodiment in which a plurality of parallel hemmed resistive regions is mutually electrically coupled so as to form a sinuous resistive path.

In this example, only the first and last additional isolating zones reach both of said semiconductor regions NW. The other additional isolating zones for their part have a staggered structure, stopping longitudinally before reaching longitudinally one of the semiconductor regions NW in alternation.

Thus, successive parallel hemmed resistive regions RP are electrically coupled by a resistive region VIR of the well, which region is located at successive ends of the additional isolating zones and located there between.

The resistive regions VIR of the well are located in the well PW and are bounded laterally by a longitudinal end of an additional isolating zone TISO and by a semiconductor region NW, of the second conductivity type, of the isolating region.

Thus, all of the resistive path is located in the well PW.

However, the configurations described above with reference to FIGS. 7 and 8, including additional isolating zones extending in the second direction X in order to bound longitudinally the resistive region, are adaptable to the embodiments described with reference to FIGS. 9 and 10.

Moreover, the various additional isolating zones allowing a sinuous resistive path to be produced may be filled with an insulator or conductor. In the case of a conductor, the potential allowing the resistance R of the resistor RES to be modified may be identical in all the additional isolating regions or not.

In this example, the additional isolating zones are filled with a conductor. Thus, to allow a bias to be applied to these zones, conductive biasing tracks PMP and biasing vias VMP connect said additional isolating zones together. In the representation of FIG. 10, the additional isolating zones are connected together in two groups, each including one respective row of the staggered additional isolating zones.

FIG. 11 shows another embodiment, in which the additional isolating zones are filled with a conductor, and in which the sinuous resistive path passes both through the hemmed resistive regions RP of the well and through the conductor deposited in the trenches T1, T2 of the additional isolating zones TISO.

Specifically, interconnects CNX electrically connect each additional isolating zone TISO to an immediately neighboring hemmed resistive region RP.

The interconnects CNX, for example, comprise interconnecting vias VM, metal tracks PM, contact regions PC located in the hemmed resistive regions CLR1, and contacts located on the conductor deposited in the trenches T1, T2.

In other words, two successive hemmed resistive regions RP are electrically coupled by way of the conductor filling the trench T1, T2 of the additional isolating zone TISO located between said two successive hemmed resistive regions RP.

This makes it possible to increase the length of the resistive path without increasing the area occupied by the front face of the well.

Moreover, the invention is not limited to these embodiments but encompasses any variant; for example, the various features of each embodiment may be combined together in one embodiment; or, moreover, the semiconductors and their conductivity types, the nature of the wells and the technological context described above have been given by way of example, the invention being adaptable to any type of integrated circuit.

The invention claimed is:

1. An integrated circuit, comprising:
   a semiconductor substrate doped with a first conductivity type;
   a semiconductor well doped with the first conductivity type, wherein a bottom of the semiconductor well is isolated from the semiconductor substrate by a buried semiconductor region doped with a second conductivity type;
   an upper trench isolation extending from a front surface of the semiconductor well to a depth located a distance from the bottom of the semiconductor well;
   at least two additional isolating zones that are electrically insulated from the semiconductor well and which extend inside the semiconductor well in a first direction and extend vertically from the front surface to the bottom of the semiconductor well;
   at least one hemmed resistive region bounded by said at least two additional isolating zones, the upper trench isolation and the buried semiconductor region; and
   at least two contact zones located level with the front surface of the semiconductor well and being electrically coupled to said at least one hemmed resistive region;
   wherein said buried semiconductor region is configured to be biased to change a resistance of the at least one hemmed resistive region extending between the at least two contact zones.

2. The integrated circuit according to claim 1, wherein said at least one hemmed resistive region is bounded in a second direction that is orthogonal to the first direction by said at least two additional isolating zones, and bounded vertically by the upper trench isolation and the buried semiconductor region.

3. The integrated circuit according to claim 1, further comprising at least one semiconductor region doped with the second conductivity type defining at least one edge of said semiconductor well from the front surface to the bottom of the semiconductor well, said at least one semiconductor region being in contact with the buried semiconductor region.

4. The integrated circuit according to claim 1, wherein the upper trench isolation is a shallow trench isolation.

5. The integrated circuit according to claim 1, wherein each contact zone of said at least two contact zones includes a highly doped semiconductor volume doped with the first conductivity type.

6. The integrated circuit according to claim 1, wherein each additional isolating zone of said at least two additional isolating zones includes a trench having an end that reaches the bottom of the semiconductor well.

7. The integrated circuit according to claim 6, further including an implanted region doped with the second conductivity type, wherein said implanted region is located in the semiconductor well adjacent a bottom portion of the trench.

8. The integrated circuit according to claim 7, wherein said implanted region is further located in the buried semiconductor region adjacent the bottom portion of the trench.

9. The integrated circuit according to claim 6, wherein said trench is at least partially filled with an insulator.

10. The integrated circuit according to claim 9, wherein said trench is at least partially filled with a conductive material, and wherein said insulator insulates the conductive material from the semiconductor well.

11. The integrated circuit according to claim 10, further including a contact on a portion of the conductive material in each trench.

12. The integrated circuit according to claim 10, wherein said conductive material is configured to be biased to change the resistance of the at least one hemmed resistive region extending between the at least two contact zones.

13. The integrated circuit according to claim 1, where said at least one hemmed resistive region comprises a plurality of hemmed resistive regions that extend parallel to each other and are mutually electrically coupled to each other in series to form a sinuous resistive path.

14. The integrated circuit according to claim 1, further including an implanted region doped with the second conductivity type, wherein said implanted region is located in the semiconductor well adjacent a bottom portion of each trench of said at least two trenches.

15. The integrated circuit according to claim 14, wherein said implanted region is further located in the buried semiconductor region adjacent the bottom portion of the trench.

16. An integrated circuit, comprising:
   a semiconductor substrate doped with a first conductivity type;
   a semiconductor well doped with the first conductivity type, wherein a bottom of the semiconductor well is isolated from the semiconductor substrate by buried semiconductor region doped with a second conductivity type;
   an upper trench isolation extending from a front surface of the semiconductor well to a depth located a distance from the bottom of the semiconductor well;
   at least two trenches that extend inside the semiconductor well in a first direction and extend vertically from the front surface completely through the semiconductor well and at least partially into the buried semiconductor region;
   wherein said at least two trenches are at least partially filled with an insulating material;
   at least one hemmed resistive region bounded by said at least two trenches that are at least partially filled with the insulating material, the upper trench isolation and the buried semiconductor region; and at least two contact zones located level with the front surface of the semiconductor well and being electrically coupled to said at least one hemmed resistive region.

17. The integrated circuit according to claim 16, wherein said buried semiconductor region is configured to be biased to change a resistance of the at least one hemmed resistive region extending between the at least two contact zones.

18. The integrated circuit according to claim 16, wherein each trench of said at least two trenches is at least partially filled with a conductive material, and wherein said insulator insulates the conductive material from the semiconductor well.

19. The integrated circuit according to claim 18, further including a contact on a portion of the conductive material in each trench.

20. The integrated circuit according to claim 18, wherein said conductive material is configured to be biased to change a resistance of the at least one hemmed resistive region extending between the at least two contact zones.

21. The integrated circuit according to claim 16, wherein said at least one hemmed resistive region is bounded in a second direction that is orthogonal to the first direction by at least two additional isolating zones, and bounded vertically by the upper trench isolation and the buried semiconductor region.

22. The integrated circuit according to claim 16, further comprising at least one semiconductor region doped with the second conductivity type defining at least one edge of said semiconductor well from the front surface to the bottom of the semiconductor well, said at least one semiconductor region being in contact with the buried semiconductor region.

23. The integrated circuit according to claim 16, wherein the upper trench isolation is a shallow trench isolation.

24. The integrated circuit according to claim 16, wherein each contact zone of said at least two contact zones includes a highly doped semiconductor volume doped with the first conductivity type.

25. The integrated circuit according to claim 16, where said at least one hemmed resistive region comprises a plurality of hemmed resistive regions that extend parallel to each other and are mutually electrically coupled to each other in series to form a sinuous resistive path.

* * * * *